United States Patent
Niimi et al.

(10) Patent No.: US 6,730,566 B2
(45) Date of Patent: May 4, 2004

(54) METHOD FOR NON-THERMALLY NITRIDED GATE FORMATION FOR HIGH VOLTAGE DEVICES

(75) Inventors: Hiroaki Niimi, Richardson, TX (US); Rajesh Khamankar, Coppell, TX (US); Husam N. Alshareef, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/264,729

(22) Filed: Oct. 4, 2002

(65) Prior Publication Data

US 2004/0067619 A1 Apr. 8, 2004

(51) Int. Cl.[7] .......................................... H01L 21/8234
(52) U.S. Cl. ........................ 438/275; 438/308; 438/920
(58) Field of Search .................................. 438/142, 275, 438/308, 585, 592, 656, 657, 682, 685

(56) References Cited

U.S. PATENT DOCUMENTS

| | | | |
|---|---|---|---|
| 5,960,289 A | 9/1999 | Tsui et al. | |
| 5,989,962 A | 11/1999 | Holloway et al. | |
| 6,171,911 B1 | 1/2001 | Yu | |
| 6,268,272 B1 | * | 7/2001 | Jang |
| 6,287,897 B1 | * | 9/2001 | Gousev et al. |
| 6,297,103 B1 | 10/2001 | Ahn et al. | |
| 6,335,262 B1 | 1/2002 | Crowder et al. | |

* cited by examiner

*Primary Examiner*—Phuc T. Dang
(74) *Attorney, Agent, or Firm*—Yingsheng Tung; Wade James Brady, III; Frederick J. Telecky, Jr.

(57) ABSTRACT

A method is provided for non-thermally nitrided gate formation of high voltage transistor devices. The non-thermally nitrided gate formation is useful in the formation of dual thickness gate dielectric structures. The non-thermally nitrided gate formation comprises nitridation to introduce nitrogen atoms into the gate dielectric layer of the high voltage transistor devices to mitigate leakage associated with the high voltage transistor devices. The nitridation of the gate dielectric layer damages the surface of the gate dielectric layer. The damaged surface of the gate dielectric layer is removed by a relatively low temperature re-oxidation process. The low temperature re-oxidation process minimizes nitrogen loss during a subsequent photoresist stripping process and mitigates film densification, such that the structure can be readily etched by standard etching chemicals in subsequent processing.

20 Claims, 6 Drawing Sheets

US 6,730,566 B2

METHOD FOR NON-THERMALLY NITRIDED GATE FORMATION FOR HIGH VOLTAGE DEVICES

TECHNICAL FIELD

The present invention relates generally to semiconductor processing and, more particularly, to a method for non-thermally nitrided gate formation for high voltage devices.

BACKGROUND OF THE INVENTION

In certain semiconductor applications it has become necessary to integrate dual gate oxide (DGO) thicknesses for associated transistor devices onto a single integrated circuit device. One motivation for performing dual gate oxide processing is that high performance transistors require thinner gate dielectric regions and operate at lower voltages (e.g., 1.8 volts to 2.5 volts), where as devices that interface with most conventional external peripherals typically require higher operating voltages such as 3.3 volts to 5.0 volts. When interfacing lower voltage high performance metal-oxide-semiconductor field-effect-transistors (MOSFETs), within a core of an integrated circuit, to higher voltage peripheral devices, input and output (I/O) buffers of the integrated circuit (IC) are typically designed to contain thicker gate dielectric regions that are compatible with the higher external peripheral device voltages.

For example, current microcontroller units (MCUs) and digital signal processors (DSPs) are integrating several different types of technology onto a single integrated circuit, such as high speed logic, power logic, static random access memory (SRAM), nonvolatile memory (NVM), embedded dynamic random access memory (DRAM), analog circuitry, and other devices and technologies onto a single circuit die. Many of these devices require different gate dielectric processing and different gate dielectric thicknesses to provide both high performance lower voltage devices within the core of the device and higher voltage I/O devices to interface with external peripheral devices.

As stated above, a dual gate thickness structure includes thin gates for high performance, low voltage operation core devices and thick gates for low leakage, high voltage operation I/O devices. As devices shrink, even the thick gates are getting thinner to meet device requirements. This can cause increased leakage current at the thick gate oxides. The leakage current can be mitigated by introducing nitrogen atoms into the gate dielectrics to suppress leakage currents for both the thin and thick gates. One method of nitrogen atom introduction is to perform non-thermal nitridation (e.g., plasma nitridation) on the gate dielectrics. However, the nitridation introduces damage (e.g., plasma damage) to the top surface of the gate dielectrics resulting in a porous surface layer. The damage can cause high gate leakage, threshold voltage shifts, or premature oxide breakdown when the devices are operating. A post-nitridation high temperature (e.g., at or above 1000° C.) re-oxidation (HT ReOx) can be performed on the gate dielectrics to mitigate the plasma damage from the gate dielectrics. However, due to the high thermal treatments, the gate dielectrics will densify, providing strong Si—N bonding in the dielectrics. This is an issue for deglaze of the I/O gates causing longer etching time resulting in over-etch issues at the isolation regions (e.g., standard trench isolation (STI) corner oxide).

Film densification and etching time can be minimized by omitting the post nitridation high temperature re-oxidation during the process. However, omission of the post nitridation high temperature re-oxidation results in gate layers that have damage (e.g., plasma damage) causing a superficial porous layer that results in less than optimal device operation. Additionally, in a subsequent photoresist removal process, the strong photoresist stripping material removes nitrogen atoms from the I/O gate dielectrics due to the looser chemical bonds in the damaged surface layer.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates generally to a method for non-thermally nitrided gate formation of high voltage transistor devices (e.g., 3.3 volts to 5.0 volts). The present invention is particularly useful in the formation of dual thickness gate dielectric structures that include thick gates (e.g., about 15 Å to about 35 Å oxide layer) for high voltage transistor devices and thin gates (e.g., about 8 Å to about 14 Å oxide layer) for low voltage transistor devices (e.g., 1.8 volts to 2.5 volts). The non-thermally nitrided gate formation comprises nitridation, for example, by plasma nitridation to introduce nitrogen atoms into the gate dielectric layer of the high voltage transistor devices. The nitridation of the gate dielectric layer damages (e.g., plasma damage) the surface of the gate dielectric layer. The damage to the surface of the gate dielectric layer is removed by a relatively low temperature (e.g., about 400° C. to about 600° C.) re-oxidation process. The low temperature re-oxidation process minimizes nitrogen loss during a subsequent photoresist stripping process, and mitigates film densification, such that the gate dielectric can be readily etched by standard etching chemicals in subsequent processing.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

The present invention relates generally to a method for non-thermally nitrided gate formation of high voltage transistor devices. The present invention is particularly useful in the formation of dual thickness gate dielectric structures. The non-thermally nitrided gate formation comprises nitridation, for example, by plasma nitridation to introduce nitrogen atoms into the gate dielectric layer associated with the high voltage transistor device. The nitridation of the gate dielectric layer damages (e.g., plasma damage) the surface of the gate dielectric layer resulting in a porous surface layer. The damage can cause high gate leakage, threshold voltage shifts, or premature oxide breakdown when the devices are operating. The damage to the surface of the gate dielectric layer is removed by a relatively low temperature re-oxidation process. The low temperature re-oxidation process is performed at a temperature less than about 1000° C. (e.g., about 400° C. to about 600° C.). The relatively low temperature re-oxidation process minimizes nitrogen loss during a subsequent photoresist stripping process, and can mitigate film densification, such that it can be readily etched by standard etching chemicals in subsequent processing.

Figure 1:
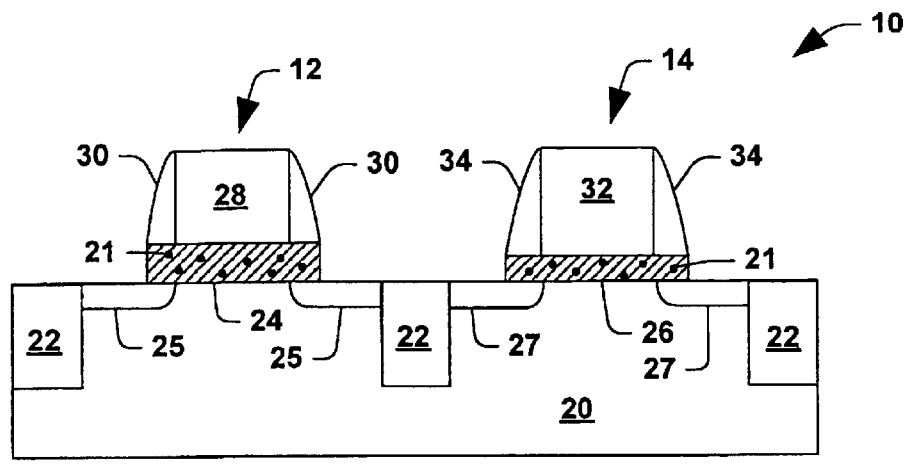
FIG. 1 is a schematic cross-sectional illustration of a dual thickness gate dielectric structure in accordance with an aspect of the present invention.

FIG. 1 illustrates a dual thickness gate dielectric structure 10 in accordance with an aspect of the present invention. The dual thickness gate dielectric structure 10 is fabricated on a substrate 20, such as silicon. The dual thickness gate dielectric structure 10 includes a first transistor device 12 (e.g., MOSFET device) having a thick gate dielectric layer 24 (e.g., about 15 Å to about 35 Å oxide layer) and a second transistor device 14 (e.g., MOSFET device) having a thin gate dielectric layer 26 (e.g., about 8 Å to about 14 Å oxide layer). It is to be appreciated that the first and second transistor devices 12 and 14 are provided for illustrative purposes and the dual thickness gate dielectric structure can include a plurality of thick gate devices and a plurality of thin gate devices. The first transistor device 12 includes a thick gate, such as for providing a low leakage, high voltage operation input/output device, and the second transistor device 14 includes a thin gate, such as for providing a high performance low voltage operation core device.

The thick gate dielectric layer 24 can be an oxide (e.g., silicon dioxide ($SiO_2$)) or a dielectric material suitable for operating as a gate oxide structure of a transistor device. Since the thick gate dielectric layer 24 is relatively thin in comparison to conventional thick gate dielectric layers, nitrogen atoms 21 are introduced into the dielectric layer 24 to suppress leakage currents associated with the operation of the first transistor device 12. The nitrogen atoms 21 can be introduced into the thick dielectric layer 24 by a plasma nitridation or plasma nitrided oxide process. The plasma nitridation process can be carried out in any of several ambients including, a nitrogen-source gas, such as $N_2$, nitric oxide ($N_2O$), nitrous oxide (NO), and ammonia ($NH_3$) or a mixture of nitrogen-source and inert gases, such as helium (He), neon (Ne), argon (Ar), krypton (Kr), and zenon (Xe), to the thick gate dielectric layer 24. However, the plasma nitridation causes a damaged (e.g., plasma damaged) surface layer of the thick gate dielectric layer 24. A relatively low temperature (e.g., about 400° C. to about 600° C.) re-oxidation process is performed on the damaged surface layer to provide a gate dielectric layer 24 substantially without surface damage and with nitrogen atoms 21 embedded therein to facilitate the mitigation of leakage of the first transistor device 12.

The low temperature re-oxidation on plasma nitrided oxide removes plasma damage from plasma nitrided oxide, and minimizes nitrogen loss during a subsequent photoresist stripping process. In addition, the low temperature re-oxidation on the plasma nitrided gate dielectric layer 24 mitigates film densification, such that it can be readily etched by the standard etching chemicals in subsequent etching processes. The first transistor device 12 also includes a gate electrode 28 disposed over the thick gate dielectric layer 24. The gate electrode 28 can be comprised of polysilicon, amorphous silicon, germanium, or metal. Sidewall spacers 30 of a suitable insulating material can be disposed adjacent to the sidewalls of the gate electrode 28. Source/drain regions 25 can also be formed in the substrate 20.

The second transistor device 14 includes a thin gate dielectric layer 26 disposed on the substrate 20. The thin dielectric gate layer 26 is thinner than the thick dielectric gate layer 24. The thin gate dielectric layer 26 can be an oxide (e.g. silicon dioxide ($SiO_2$)) or a dielectric material suitable for operating as a gate oxide structure of a transistor device. Nitrogen atoms 21 can also be introduced into the dielectric layer 26 by a plasma nitridation or plasma nitrided oxide process. Since the second gate dielectric layer 26 is a thin gate dielectric layer device for low voltage and high performance, the leakage associated with the operation of the second transistor device 14 is not as deleterious as is the leakage associated with the high voltage device 12. The second transistor device 14 also includes a gate electrode 32 disposed over the thin gate dielectric layer 26. The gate electrode 32 can be comprised of polysilicon, amorphous silicon, germanium, or metal. Sidewall spacers 34 of a suitable insulating material can be disposed adjacent to the sidewalls of the gate electrode 32. Source/drain regions 27 can also be formed in the substrate 20.

The source/drain regions 25 and 27 also can include source/drain extensions that extend to regions generally aligned with and partially beneath the respective edges of the gate electrodes 28 and 32. Those skilled in the art will understand and appreciate that first and second transistors can be either P type or N type transistors. The source/drain regions 25 and 27 can be formed as N or P type regions by doping with boron, arsenic or other appropriate doping materials, as known in the art.

Figure 2:
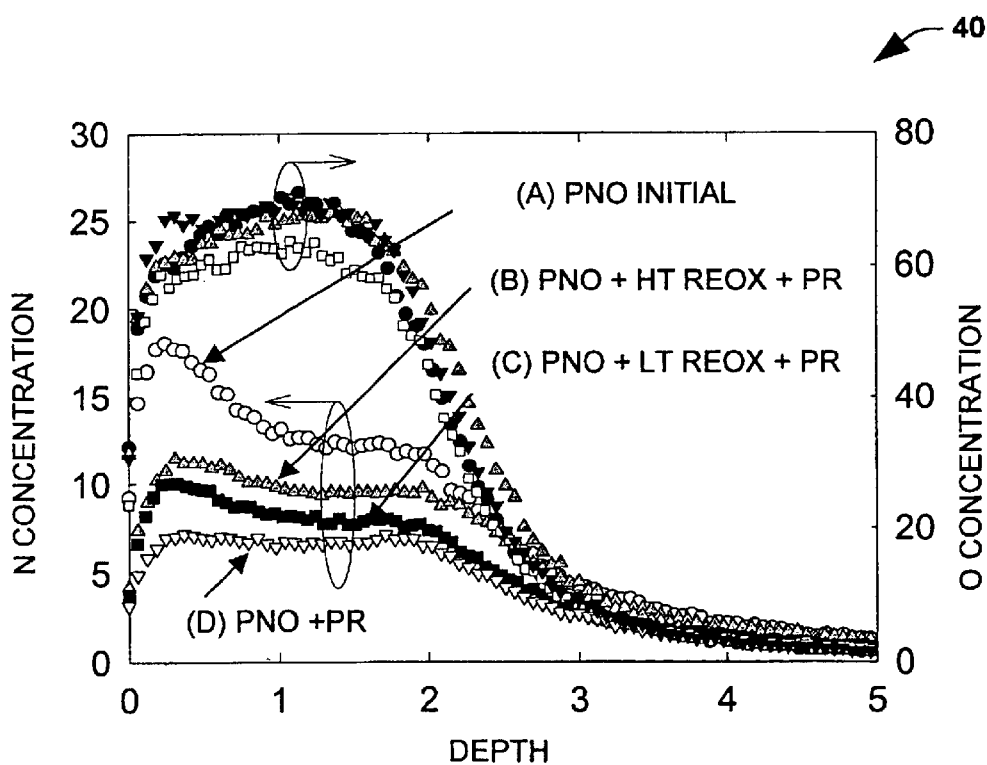
FIG. 2 illustrates a graph of nitrogen concentration versus gate dielectric depth of the thick gate dielectric layer for different processes associated with introducing nitrogen into the thick gate dielectric layer.

FIG. 2 illustrates a graph 40 of nitrogen concentration and oxygen concentration versus gate dielectric depth of a thick gate dielectric layer (e.g., 15–35 Å oxide layer) for different processes associated with introducing nitrogen into the thick gate dielectric layer. A first indicator (a) references data points (represented by circles) associated with nitrogen concentration in a dielectric layer versus depth after a plasma nitrided oxide process is performed on the dielectric layer. A second indicator (b) references data points (represented by triangles) associated with nitrogen concentration in a dielectric layer versus depth after a plasma nitrided oxide process (e.g., applying nitrogen-source gas, such as $N_2$, $N_2O$, NO, and $NH_3$ or a mixture of a nitrogen-source and inert gases, such as He, Ne, Ar, Kr, and Xe), a high temperature re-oxidation (e.g., at or above 1000° C.) and a photoresist strip process (e.g., Ultra-Violet (UV)/Ozone ($O_3$)/Sulfuric Acid ($H_2SO_4$) stripping process) has been performed on the dielectric layer. A third indicator (c) references data points (represented by squares) associated with nitrogen concentration in a dielectric layer versus depth after a plasma nitrided oxide process, a low temperature reoxidation (e.g., below 1000° C.) and a photoresist strip process has been performed on the dielectric layer in accordance with an aspect of the present invention. A fourth indicator (d) references data points (represented by inverted triangles) associated with nitrogen concentration in a dielectric layer versus depth after a plasma nitrided oxide process and a photoresist strip process has been performed on the dielectric layer, such that the re-oxidation step has been omitted.

As illustrated in the graph 40, if the re-oxidation process is omitted as illustrated in the fourth indicator (d), the dielectric layer loses a substantially large amount of nitrogen during the photoresist stripping process and also degrades dielectric quality. If a high temperature re-oxidation is performed as illustrated in the second indicator (b), the nitrogen atom loss is minimized, however, the thick dielectric layer becomes difficult to etch by standard etching chemicals due to strong silicon-nitrogen bonds. The low temperature re-oxidation as illustrated in the third indicator (c) minimizes the nitrogen (N) loss during the photoresist stripping process and substantially mitigates film densification.

Figure 3:
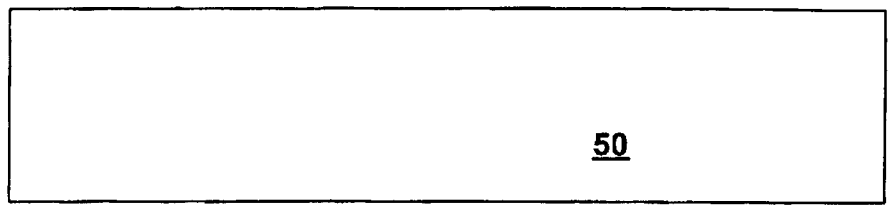
FIG. 3 illustrates a schematic cross-sectional view of a substrate in accordance with an aspect of the present invention.

FIGS. 3–17 illustrate a methodology of fabricating a semiconductor device having dual gate dielectric thickness layers in accordance with an aspect of the present invention. FIG. 3 illustrates a substrate layer 50 that can be formed from a semiconductor material, such as silicon or polysilicon. However, the substrate 50 can be formed from any materials such as gallium arsenide, germanium, silicon-germanium, epitaxial formations, silicon carbide, indium phosphide, silicon-on-insulator substrates (SOI), strained Si substrates, and/or other semiconductor substrate materials.

Figure 4:
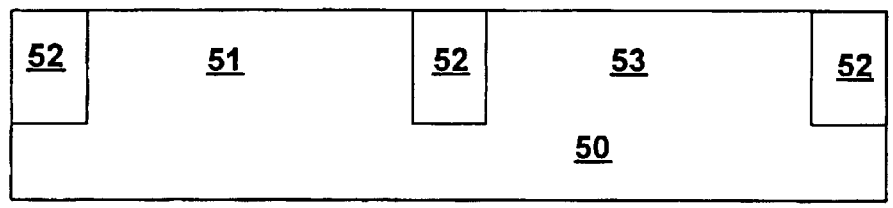
FIG. 4 illustrates a schematic cross-sectional view of the structure of FIG. 3 after trench isolation regions have been formed in accordance with an aspect of the present invention.

FIG. 4 illustrates the structure after trench isolation regions 52 are formed within the substrate 50. The trench isolation regions 52 are formed by etching (e.g., reactive ion etching) trenches selectively within portions of the substrate 50, and filling the trenches with a dielectric fill material, such as tetraethylorthosilicate (TEOS). The TEOS material can then be chemically-mechanically polished (CMP) or planarized to provide resultant trench structures illustrated in FIG. 4. Optionally, a liner (not shown) can be formed within the trench regions 52 prior to filling the trenches with TEOS material. The liner can be for example, a thin thermally grown silicon dioxide layer or an oxynitride layer. It is to be appreciated that alternative isolation schemes can be employed in place of the trench regions 52, such as local oxidation of silicon (LOCOS). In the present example, the trench isolation regions 52 isolate a first active region 51 for fabricating a thick gate device and a second active region 53 for fabricating a thin gate device. After the isolation regions 52 are formed, a pre-gate clean up is then performed on the substrate 50.

Figure 5:
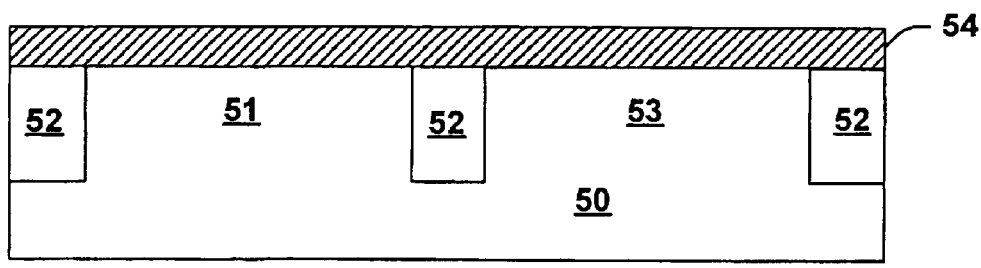
FIG. 5 illustrates a schematic cross-sectional illustration of the structure of FIG. 4 after a gate dielectric layer is formed over the substrate in accordance with an aspect of the present invention.

FIG. 5 illustrates the substrate structure 50 after an oxidation process is initiated to form a gate dielectric layer 54 (e.g., silicon dioxide ($SiO_2$) layer) over the substrate 50. The gate dielectric layer 54 can have a thickness of about 15 Å to about 35 Å, and be formed by a wet and/or dry thermal oxidation processing. It is to be appreciated that alternate methodologies can be employed to form the gate dielectric layer 54. For example, any suitable technique (e.g., thermal oxidation, plasma enhanced chemical vapor deposition (CVD), thermal enhanced CVD and spin on techniques) may be employed in forming the gate oxide layer 54. Examples of CVD processes that may be utilized in accordance with an aspect of the present invention, include Low Pressure CVD (LPCVD), Plasma Enhanced CVD (PECVD), and Rapid Thermal CVD (RTCVD). It is to be appreciated, that other types of thin film formation can be employed, such as other deposition techniques (e.g., Physical Vapor Deposition (PVD)) and film growth techniques.

Additionally, alternate materials can be employed to provide the gate dielectric material. The gate dielectric material, for example, is $SiO_2$ or another suitable oxide material that can perform the operation associated with the gate dielectric material. Examples of some materials that could be utilized as the gate dielectric layer 54 include $AlO_3$, $ZrO_2$, $HfO_2$ (AlHf) $O_x$, $HfO_2$, $La_2O_3$ and $Y_2O_3$ to name a few. Those skilled in the art will understand and appreciate appropriate types of deposition techniques that can be employed to grow suitable crystalline structures to form gate dielectric layers, such as those identified above. It is to be further understood and appreciated that other materials also could be employed to form the gate dielectric layer 54.

Figure 6:
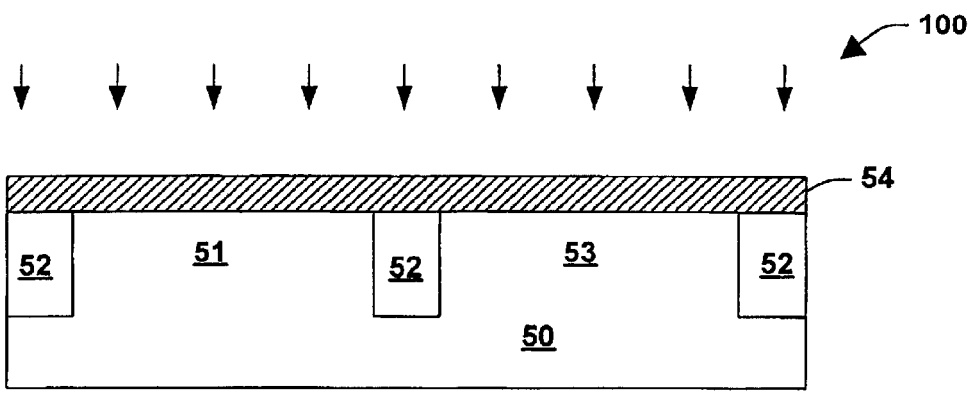
FIG. 6 illustrates a schematic cross-sectional illustration of the structure of FIG. 5 undergoing a nitridation process in accordance with an aspect of the present invention.

FIG. 6 illustrates the introduction of nitrogen into the gate dielectric layer 54 by a plasma nitridation or plasma nitrided oxide process 100. The plasma nitridation process 100 can include applying nitrogen-source gas, such as $N_2$, $N_2O$, NO, and $NH_3$ or a mixture of a nitrogen-source gas and inert gases, such as He, Ne, Ar, Kr, and Xe, to the exposed surface of the gate dielectric layer 54. The plasma nitridation can be utilized by employing a plasma nitridation system, such as available from Applied Materials, Inc. of Santa Clara, U.S.A. or Tokyo Electron Limited of Tokyo, Japan. The plasma nitridation process or nitrided oxide process 100 introduces nitrogen atoms 55 into the gate dielectric layer 54 which mitigates leakage associated with thick gate I/O devices. In one aspect of the invention, the plasma nitridation process or plasma nitrided oxide process is performed for about 3 seconds to about 60 seconds at a power of about 2 watts to about 2000 watts at a pressure of about 5 mTorr to about 50 Torr. The plasma nitridation also causes a plasma damaged surface layer 56 (FIG. 7) resulting in a porous surface layer. The plasma damage to the surface layer 56 can cause high gate leakage, threshold voltage shifts, or premature oxide breakdown when the devices are operating.

Figure 7:
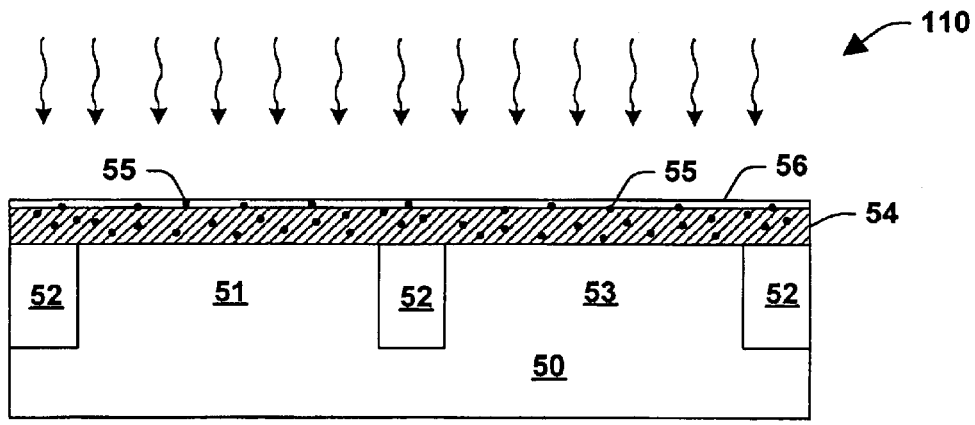
FIG. 7 illustrates a schematic cross-sectional illustration of the structure of FIG. 6 undergoing a re-oxidation process in accordance with an aspect of the present invention.
Figure 8:
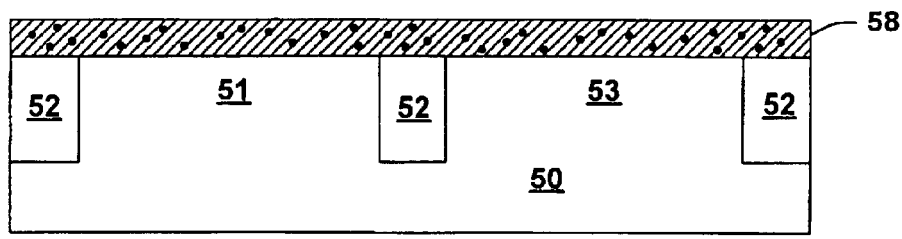
FIG. 8 illustrates a schematic cross-sectional illustration of the structure of FIG. 7 after the re-oxidation process in accordance with an aspect of the present invention.
Figure 9:
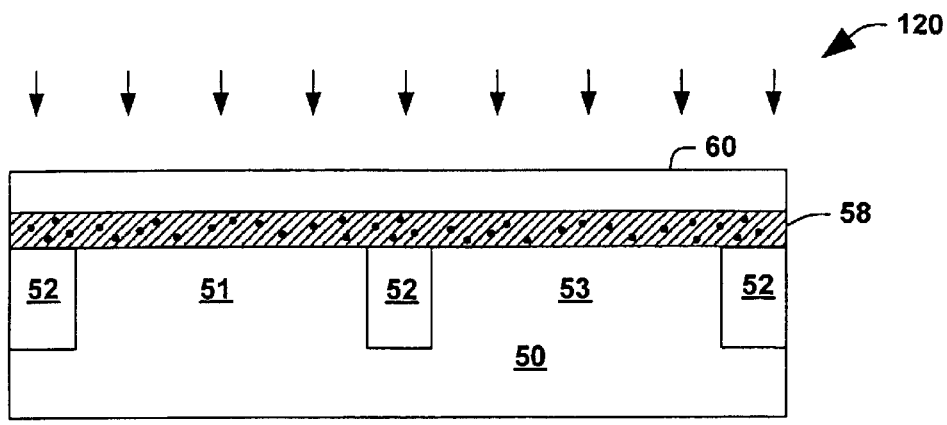
FIG. 9 illustrates a schematic cross-sectional illustration of the structure of FIG. 8 undergoing a photoresist patterning process in accordance with an aspect of the present invention.

FIG. 7 illustrates a relatively low temperature re-oxidation process 110 being performed on the damaged surface layer 56 to provide a gate dielectric layer 58 (FIG. 8) without surface damage and with nitrogen atoms 53 embedded therein to facilitate the mitigation of leakage of thick gate dielectric I/O devices. The relatively low temperature re-oxidation on plasma nitrided oxide includes performing a re-oxidation process at a temperature of about 400° C. to about 600° C. for about 30 to about 60 seconds, at a pressure of about 1 to about 50 Torr with a gas having about 1% to about 50% volume of an oxygen-source such as $O_2$, $N_2O$, and NO in an inert gas, such as He, Ne, Ar, Kr, Xe and $N_2$. The low temperature re-oxidation 110 removes plasma damage from the plasma nitrided dielectric layer 58 (FIG. 8), and minimizes nitrogen loss during a subsequent photoresist stripping process (e.g., Ultra-Violet (UV)/Ozone ($O_3$)/Sulfuric Acid ($H_2SO_4$)). In addition, the low temperature re-oxidation 110 on the plasma nitrided dielectric layer 58 mitigates film densification of the gate dielectric layer 58, such that the gate dielectric layer 58 can be readily etched by the standard etching chemicals in subsequent processing. The re-oxidation process 110 can be performed in a rapid thermal processing (RTP) chamber or an oxidation furnace.

Figure 10:
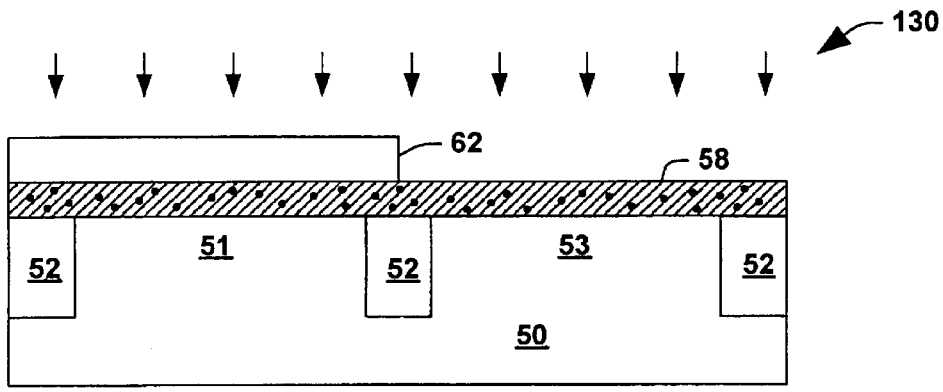
FIG. 10 illustrates a schematic cross-sectional illustration of the structure of FIG. 9 undergoing an etching process in accordance with an aspect of the present invention.

A photoresist layer 60 (FIG. 9) is formed on the gate dielectric layer 58. The photoresist layer 60 can have a thickness suitable for carrying out the present invention. Accordingly, the thickness of the photoresist layer 60 can vary in correspondence with the wavelength of radiation used to pattern the photoresist layer 60. The photoresist layer 60 may be formed over gate dielectric layer 58 via conventional spin-coating or spin casting deposition techniques. An etch step 120 (e.g., anisotropic reactive ion etching (RIE)) (FIG. 9) is performed to provide a patterned photoresist layer 62 (FIG. 10). Preferably, a selective etch technique is used to etch the photoresist material layer 60 at a relatively greater rate as compared to the rate of the underlying gate dielectric layer 58 to provide the patterned photoresist layer 62. The patterned photoresist layer 62 is used as a mask for selectively etching the gate dielectric layer 58. The patterned photoresist layer 62 will protect the thick gate dielectric layer 58 located in the first active area 51 from subsequent processing.

An etch step 130 (e.g., chemical wet etching) (FIG. 10) is performed to remove the thick gate dielectric layer 58 from the substrate 50 except from the first active region 51. Any suitable etch technique may be used to etch the gate dielectric layer 58. For example, the gate dielectric layer 58 can be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor. Any combination of a wet or dry etch process can be employed to remove the gate dielectric layer 58 from the substrate 50. Preferably, a selective etch technique is used to etch the gate dielectric layer 58 at a relatively greater rate as compared to the rate of the patterned photoresist layer 62 and the underlying substrate 50. The resultant structure after the thick gate dielectric etch 130 is illustrated in FIG. 11.

Figure 11:
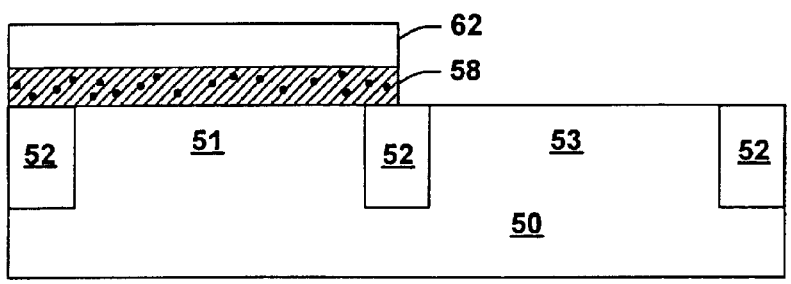
FIG. 11 illustrates a schematic cross-sectional illustration of the structure of FIG. 10 after undergoing the etching process in accordance with an aspect of the present invention.
Figure 12:
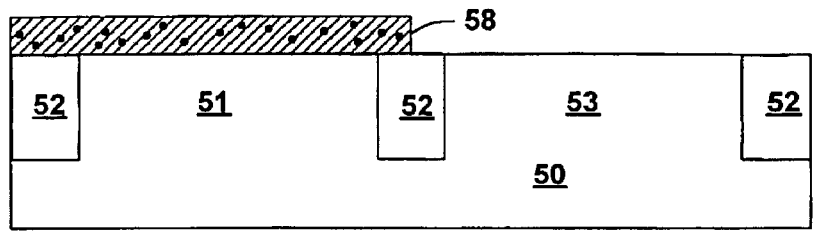
FIG. 12 illustrates a schematic cross-sectional illustration of the structure of FIG. 11 after undergoing a photoresist stripping process in accordance with an aspect of the present invention.

FIG. 12 illustrates a partially complete structure after a stripping step (e.g., Ultra-Violet (UV)/Ozone ($O_3$)/Sulfuric Acid ($H_2SO_4$) at about 130° C.) to remove the remaining portions of the patterned photoresist layer 62 (FIG. 11). A wet chemical cleanup is then performed on the structure of FIG. 12 in preparation of the formation of the thin gate dielectric portion of the structure in the second active region 53. The wet chemical cleanup can include a silicon surface cleaning process, such as an RCA (Radio Corporation of America) clean and/or a SPM (sulfuric acid-hydrogen peroxide-water solution) clean. The RCA clean is the industry standard for removing contaminants from wafers. The basic procedure was developed by Werner Kem in 1965 while working for RCA (Radio Corporation of America). The RCA cleaning procedure has three major steps used sequentially that are organic clean, oxide strip and ionic clean. Those skilled in the art would be familiar with a variety of different wet chemical cleanup procedures that can be employed to clean the structure of FIG. 12.

Figure 13:
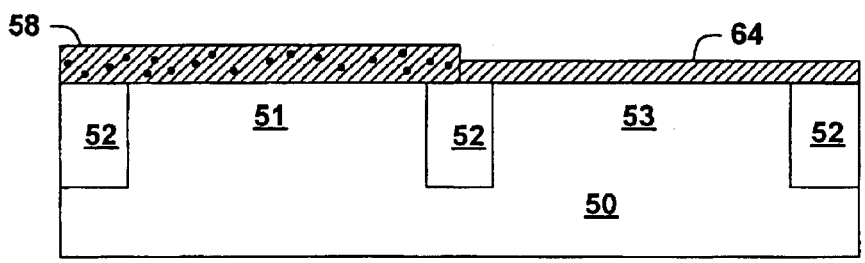
FIG. 13 illustrates a schematic cross-sectional illustration of the structure of FIG. 12 after a second gate dielectric layer is formed over the substrate in accordance with an aspect of the present invention.

FIG. 13 illustrates the substrate structure 50 after a second oxidation process is initiated to form a thin gate dielectric layer 64, for example, a silicon dioxide ($SiO_2$) layer 64 within the second active region 53 between the various trench regions 52. The gate dielectric layer 64 can have a thickness of about 8 Å to about 14 Å, and be formed by a wet and/or dry thermal oxidation processing. It is to be appreciated that alternate methodologies can be employed to form the gate dielectric layer 64. For example, any suitable technique (e.g., thermal oxidation, plasma oxidation, plasma enhanced chemical vapor deposition (CVD), thermal enhanced CVD and spin on techniques) may be employed in forming the gate dielectric layer 64. Additionally, alternate materials can be employed to provide the gate dielectric layer 64. The thick gate dielectric layer 58 grows very little during the second oxidation process, since the nitrogen atoms in the thick gate dielectric layer 58 acts as an oxygen block.

Figure 14:
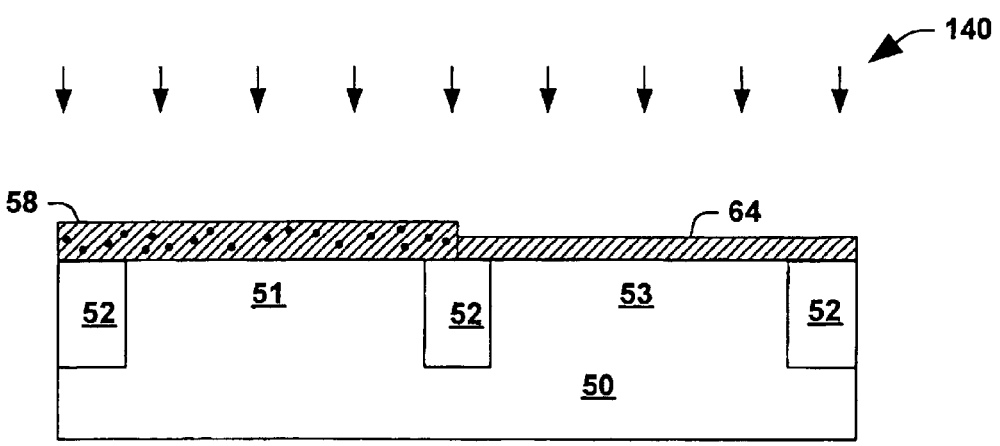
FIG. 14 illustrates a schematic cross-sectional illustration of the structure of FIG. 13 undergoing a second nitridation process in accordance with an aspect of the present invention.
Figure 15:
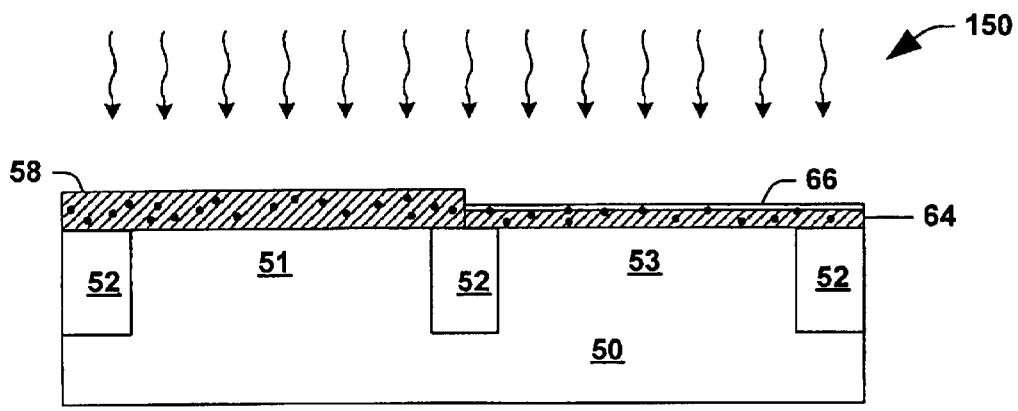
FIG. 15 illustrates a schematic cross-sectional illustration of the structure of FIG. 14 undergoing a second re-oxidation process in accordance with an aspect of the present invention.
Figure 16:
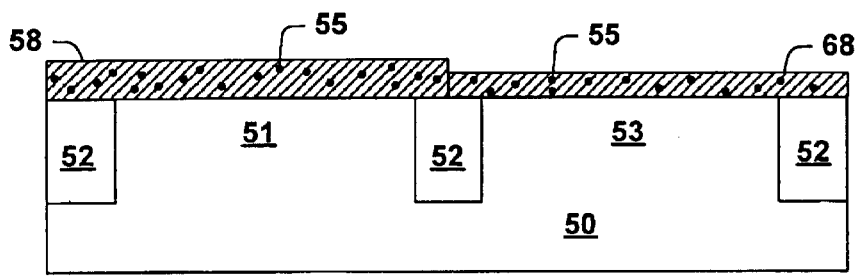
FIG. 16 illustrates a schematic cross-sectional illustration of the structure of FIG. 15 after undergoing the second re-oxidation process in accordance with an aspect of the present invention.
Figure 17:
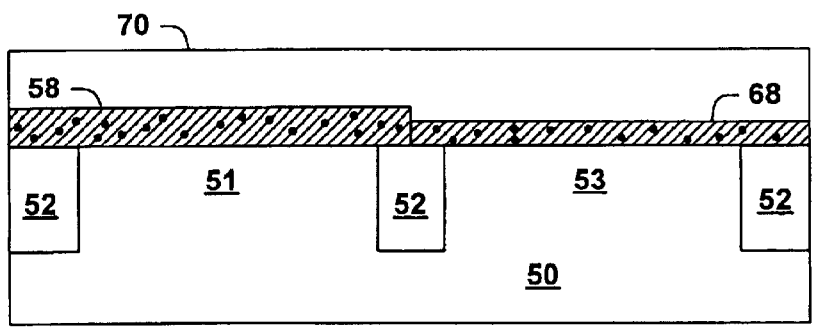
FIG. 17 illustrates a schematic cross-sectional illustration of the structure of FIG. 16 after undergoing a conductive layer deposition process in accordance with an aspect of the present invention.

FIG. 14 illustrates a second introduction process of nitrogen atoms into the gate dielectric layer 64 by a plasma nitridation or plasma nitrided oxide process 140. The plasma nitridation process 140 can include applying nitrogen-source gas, such as $N_2$, $N_2O$, NO, and $NH_3$ or mixture of nitrogen-source and inert gases, such as He, Ne, Ar, Kr, and Xe to the exposed surface of the gate dielectric layer 64. The plasma nitridation process or nitrided oxide process introduces nitrogen into the gate dielectric layer 64 which mitigates leakage associated with thin gate core devices. In one aspect of the invention, the plasma nitridation process or plasma nitrided oxide process 140 is performed for about 3 seconds to about 60 seconds at a power of about 2 watts to about 2000 watts at a pressure of about 5 mTorr to about 50 Torr. The plasma nitridation also causes a damaged surface layer 66 (FIG. 15). The second plasma nitridation should be gentle enough so as to not substantially modify the nitrogen profile in the thick gate dielectric layer 58.

FIG. 15 illustrates a second re-oxidation process 150 being performed on the damaged surface layer 66 to provide a thin dielectric layer 68 without surface damage (FIG. 16) and with nitrogen atoms 55 embedded therein to facilitate the mitigation of leakage of thin gate devices. The second re-oxidation 150 on plasma nitrided dielectric layer 68 includes re-oxidation at a temperature of about 400° C. to about 1200° C. for about 1 to about 60 seconds, at a pressure of about 1 to about 50 Torr with a gas having about 1% to about 50% of an oxygen-source such as $O_2$, $N_2O$, and NO in an inert gas such as He, Ne, Ar, Kr, Xe and $N_2$. The second re-oxidation process 150 can be performed in a rapid thermal processing (RTP) chamber or an oxidation furnace.

A conductive layer 70 is then deposited over the resultant structure to provide the conductive gate electrodes of the gate structures. If the gate electrodes are comprised of polysilicon, the conductive layer 70 may be formed using any suitable technique including chemical vapor deposition (CVD) techniques, such as low pressure chemical vapor deposition (LPCVD) or plasma enhanced chemical vapor deposition (PECVD). If conductive layer 70 is comprised of amorphous silicon or germanium, standard deposition techniques may be employed. If the conductive layer 70 is comprised of a metal, standard sputtering techniques may be employed. After formation of the conductive layer 70, the remaining portions of the thin gate and thick gate devices are formed to provide a structure similar to that illustrated in FIG. 1.

Those skilled in the art will understand and appreciate various processing operations that can be utilized in formation of transistors in accordance with an aspect of the present invention. By way of example, the gate electrodes can be patterned via photolithography and etched (e.g., via an etch chemistry or plasma etching) to form the gate electrode structures. Ion implantation or other doping techniques can be utilized to form source/drain regions 25 and 27 (FIG. 1) and associated source/drain electrodes. The type and amount of doping can be varied according to the type of device structure desired. It further is to be appreciated that the gate electrode structures can be used in the formation of CMOS, BiCMOS or HBT devices. It is to be appreciated that a plurality of thick gate devices can be formed in the first active area 51 and a plurality of thin gate devices can be formed in the second active area 53 by conventional masking, patterning, etching and doping processes to provide an integrated device on a single substrate with a plurality of thick and thin gate devices.

What has been described above includes examples and implementations of the present invention. Because it is not possible to describe every conceivable combination of components, circuitry or methodologies for purposes of describing the present invention, one of ordinary skill in the art will recognize that may further combinations and permutations of the present invention are possible. Accordingly, the present invention is intended to embrace all such alterations, modifications and variations that fall within the spirit and scope of the appended claims.

What is claimed is:

1. A method for fabrication of a transistor device, the method comprising:
   forming a gate dielectric layer over a substrate;
   introducing nitrogen atoms into the gate dielectric layer to mitigate leakage associated with the operation of the transistor device, the introduction of nitrogen atoms causing surface damage to the gate dielectric layer; and
   performing a re-oxidation process at a relatively low temperature on the gate dielectric layer to remove the surface damage from the gate dielectric layer.

2. The method of claim 1, the relatively low temperature re-oxidation process being performed at a temperature of about 400° C. to about 600° C.

3. The method of claim 2, the relatively low temperature re-oxidation process being performed for about 30 to about 60 seconds with a gas having about 1% to about 50% of an oxygen-source in an inert gas.

4. The method of claim 3, the oxygen-source comprising at least one of $O_2$, $N_2O$, and NO and the inert gas comprising at least one of He, Ne, Ar, Kr, Xe and $N_2$.

5. The method of claim 2, the gate dielectric layer having a thickness of about 15 Å to about 35 Å.

6. The method of claim 1, further comprising forming a second gate dielectric layer over the substrate, the second gate dielectric layer being associated with a second transistor device, the second gate dielectric layer having a thickness that is thinner than the gate dielectric layer.

7. The method of claim 1, the introduction of nitrogen atoms comprising performing a plasma nitridation process on the gate dielectric layer by applying one of a nitrogen-source gas and a mixture of a nitrogen-source gas and an inert gas to an exposed surface the gate dielectric layer for about 3 seconds to about 60 seconds at a power of about 2 watts to about 2000 watts at a pressure of about 5 mTorr to about 50 Torr, the nitrogen-source gas comprising one of $N_2$, $N_2O$, NO, and $NH_3$ and the inert gas comprising one of He, Ne, Ar, Kr, and Xe.

8. The method of claim 1, further comprising forming a photoresist layer over the gate dielectric layer, patterning the photoresist layer to expose portions of the gate dielectric layer that does not form part of the transistor device, etching the gate layer to remove the exposed portions of the gate dielectric layer and stripping the patterned photoresist layer by an Ultra-Violet (UV) Ozone ($O_3$)/Sulfuric Acid ($H_2SO_4$) stripping process at about 130° C.

9. A method for fabrication of a semiconductor device having dual gate dielectric thickness layers, the method comprising:
   forming a first gate dielectric layer in a first active region of a semiconductor device;
   performing a plasma nitridation process to introduce nitrogen atoms into the first gate dielectric layer, the plasma nitridation process causing surface damage to the gate dielectric layer;
   performing a re-oxidation process at a relatively low temperature on the gate dielectric layer to remove the surface damage from the gate dielectric layer,
   forming a second gate dielectric layer in a second active region, the second gate dielectric layer being thinner than the first gate dielectric layer; and
   forming a first transistor device associated with the first gate dielectric layer and a second transistor device associated with the second gate dielectric layer, the nitrogen atoms mitigating leakage associated with the operation of the first transistor device.

10. The method of claim 9, the relatively low temperature re-oxidation process being performed at a temperature of about 400° C. to about 600° C. for about 30 to about 60 seconds with a gas having about 1% to about 50% of an oxygen-source in an inert gas, the oxygen-source comprising at least one of $O_2$, $N_2O$, and NO and the inert gas comprising at least one of He, Ne, Ar, Kr, Xe and $N_2$, the relatively low temperature reoxidation process mitigates nitrogen loss in the dielectric layer caused by subsequent photoresist stripping and mitigates film densification for a subsequent etching process.

11. The method of claim 9, the first gate dielectric layer having a thickness of about 15 Å to about 35 Å and the second gate dielectric layer having a thickness of about 8 Å to about 14 Å.

12. The method of claim 9, the first gate dielectric layer and the second dielectric layer comprising an oxide.

13. The method of claim 9, the plasma nitridation process on the first gate dielectric layer comprising applying one of a nitrogen-source gas and a mixture of a nitrogen-source gas and an inert gas to an exposed surface the first gate dielectric layer for about 3 seconds to about 60 seconds at a power of about 2 watts to about 2000 watts at a pressure of about 5 mTorr to about 50 Torr, the nitrogen-source gas comprising one of $N_2$, $N_2O$, NO, and $NH_3$ and the inert gas comprising one of He, Ne, Ar, Kr, and Xe,.

14. The method of claim 9, further comprising forming a photoresist layer over the first gate dielectric layer, patterning the photoresist layer to expose portions of the first gate dielectric layer that do not form part of the first transistor device, etching the first gate dielectric layer to remove the exposed portions of the first gate dielectric layer and stripping the patterned photoresist layer by an Ultra-Violet (UV)/Ozone ($O_3$)/Sulfuric Acid ($H_2SO_4$) stripping process at about 130° C.

15. The method of claim 14, further comprising performing a wet chemical cleanup on the semiconductor device after stripping the patterned photoresist layer.

16. The method of claim 9, the forming a first gate dielectric layer in a first active region of a semiconductor device comprising performing a first oxidation process to form the first gate dielectric layer and the forming a second gate dielectric layer in a second active region comprising performing a second oxidation process to form the second gate dielectric layer.

17. The method of claim 9, further comprising:

performing a second plasma nitridation process to introduce nitrogen atoms into the second gate dielectric layer, the second plasma nitridation comprising applying one of a nitrogen-source gas and a mixture of nitrogen-source gas and inert gas to an exposed surface the second gate dielectric layer for about 3 seconds to about 60 seconds at a power of about 2 watts to about 2000 watts at a pressure of about 5 mTorr to about 50 Torr, the nitrogen-source gas comprising at least one of $N_2$, $N_2O$, NO, and the inert gas comprising $NH_3$ He, Ne, Ar, Kr, and Xe,; and performing a second re-oxidation process on the second gate dielectric layer to remove damage to the second gate dielectric layer caused by the second plasma nitridation process, the second re-oxidation process being performed at a temperature of about 400° C. to about 1200° C. for about 1 to about 60 seconds with a gas having about 1% to about 50% of an oxygen-source gas in an inert gas, the oxygen-source gas being one of $O_2$, $N_2O$, and NO and the inert gas being one of He, Ne, Ar, Kr, Xe and $N_2$.

18. A method for fabricating a first transistor device having a first gate oxide thickness and a second transistor device having a second gate oxide thickness on the same substrate, the method comprising:

forming a first gate oxide layer having a thickness of about 15 Å to about 35 Å in a first active region of a substrate;

performing a plasma nitridation process to introduce nitrogen atoms into the first gate oxide layer, the plasma nitridation process comprising applying one of a nitrogen-source gas and a mixture of a nitrogen-source gas and inert gas to an exposed surface the first gate oxide layer for about 3 seconds to about 60 seconds at a power of about 2 watts to about 2000 watts at a pressure of about 5 mTorr to about 50 Torr, the nitrogen-source gas comprising at least one of $N_2$, $N_2O$, NO, and $NH_3$ and the inert gas comprising at least one of He, Ne, Ar, Kr, and Xe;

performing a relatively low temperature re-oxidation process on the first gate oxide layer to remove damage to the first gate oxide layer caused by the plasma nitridation process, the relatively low temperature re-oxidation process being performed at a temperature of about 400° C. to about 600° C. for about 30 to about 60 seconds with a gas having about 1% to about 50% of an oxygen-source in an inert gas, the oxygen-source comprising at least one of $O_2$, $N_2O$, and NO and the inert gas comprising at least one of He, Ne, Ar, Kr, Xe and $N_2$;

forming a second gate oxide layer having a thickness of about 8 Å to about 14 Å in a second active region of the substrate; and forming a first transistor device associated with the first gate oxide layer and a second transistor device associated with the second gate oxide layer, the nitrogen atoms in the first gate oxide layer mitigates leakage associated with the operation of the first transistor device.

19. The method of claim 9, further comprising forming a photoresist layer over the first gate oxide layer, patterning the photoresist layer to expose portions of the first gate oxide layer that do not form part of the first transistor device, etching the first gate oxide layer to remove the exposed portions of the first gate oxide layer and stripping the patterned photoresist layer by a Ultra-Violet (UV)/Ozone ($O_3$)/Sulfuric Acid ($H_2SO_4$) stripping process at about 130° C.

20. The method of claim 19, further comprising:

performing a second plasma nitridation process to introduce nitrogen atoms into the second gate oxide layer comprising applying one of a nitrogen-source gas and a mixture of a nitrogen-source and inert gas to an exposed surface the second gate oxide layer for about 3 seconds to about 60 seconds at a power of about 2 watts to about 2000 watts at a pressure of about 5 mTorr to about 50 Torr, the nitrogen-source gas comprising one of $N_2$, $N_2O$, NO, and $NH_3$ and the inert gas comprising at least one of He, Ne, Ar, Kr, and Xe; and performing a second re-oxidation process on the second gate dielectric layer to remove damage to the second gate dielectric layer caused by the second plasma nitridation process, the second re-oxidation process being performed at a temperature of about 400° C. to about 1200° C. for about 1 to about 60 seconds with a gas having about 1% to about 50% of an oxygen-source in an inert gas, the oxygen-source comprising at least one of $O_2$, $N_2O$, and NO and the inert gas comprising at least one of He, Ne, Ar, Kr, Xe and $N_2$.

* * * * *